United States Patent [19]

Friedman

[11] Patent Number: 5,262,714

[45] Date of Patent: Nov. 16, 1993

[54] SINEWAVE FREQUENCY MEASURING APPARATUS

[76] Inventor: Vladimir Friedman, 2117 Dogwood Dr., Scotch Plains, N.J. 07090

[21] Appl. No.: 33,447

[22] Filed: Mar. 18, 1993

Related U.S. Application Data

[63] Continuation of Ser. No. 831,866, Feb. 5, 1992, abandoned.

[51] Int. Cl.$^5$ ............................................. G01R 23/02
[52] U.S. Cl. ................................ 324/76.42; 324/76.48; 324/76.24; 324/76.15; 377/50
[58] Field of Search ........................ 377/19, 20, 21, 22, 377/23, 24, 50; 324/76.15, 76.24, 76.42, 76.48

[56] References Cited

U.S. PATENT DOCUMENTS

| | | |
|---|---|---|
| 3,036,269 | 5/1962 | Trumpy . |
| 3,553,597 | 1/1971 | Bugay ................................ 324/78 E |
| 3,590,277 | 6/1971 | South ................................ 324/78 E |
| 3,663,885 | 5/1972 | Stewart ............................ 324/78 D |
| 3,704,414 | 11/1972 | Herbst . |
| 3,743,420 | 7/1973 | Iten et al. . |
| 3,839,673 | 10/1974 | Acker . |
| 3,984,773 | 10/1976 | Oda . |
| 4,028,985 | 6/1977 | Merritt . |
| 4,112,358 | 9/1978 | Ashida ................................ 324/78 D |
| 4,326,261 | 4/1982 | Peoples . |
| 4,403,298 | 9/1983 | May, Jr. . |
| 4,438,504 | 3/1984 | Favin . |
| 4,823,060 | 4/1989 | Doemen . |

Primary Examiner—Kenneth A. Wieder
Assistant Examiner—Jose Solis
Attorney, Agent, or Firm—Weingram & Zall

[57] ABSTRACT

This invention relates to sinewave frequency measuring apparatus and method and more particularly such apparatus including a frequency estimator triggered by a zero crossing of a sinewave and means for producing sample signals at a constant rate; and a method which provides and uses an approximation of the sinewave through the zero crossing, as a straight line between two sampling periods. Errors are eliminated by means of a low pass filter. The method performs a fractional cycle correction by adding or substracting the interpolation results from the raw period time counts.

9 Claims, 12 Drawing Sheets

SINEWAVE FREQUENCY MEASURING APPARATUS

This is a continuation of copending application Ser. No. 07/831,866 filed on Feb. 5, 1992, now abandoned.

BACKGROUND OF THE INVENTION AND METHOD

1. Field of the Invention

This invention relates to sinewave frequency measuring apparatus and method and more particularly to such apparatus including a frequency estimator triggered by a zero crossing of a sinewave and means for producing sample signals at a constant rate; and a method which provides and uses an approximation of the sinewave through the zero crossing, as a straight line between two sampling periods. Errors are eliminated by means of a low pass filter.

2. Related Art

The present state of the art discloses apparatus for analyzing and measuring signals. However, the state of the art is devoid of using the apparatus and method of the present invention for ascertaining the frequency of a sinewave.

For instance, U.S. Pat. No. 3,036,269, issued to Trumpy discloses a circuit for ascertaining the frequency of a supply signal. In one embodiment disclosed by Trumpy, the reference frequency is obtained from a mono-stable vibrator. The signal of unknown frequency is divided so that part of that signal is directed to a Zener diode, with the remainder of that signal being directed to continue flowing through the circuit. The Zener diode allows only the positive half of the sinewave to pass therethrough, so that it passes through to the vibrator as a square wave signal. The square wave signal unbalances the vibrator and the output of the unbalanced vibrator is then joined to the remainder signal. The combined signal then goes into a switched amplifier, whose emitted pulse is measured in width to determine the frequency of the supply signal, since a filter after the switch amplifier will sense the difference between the known frequency or reference frequency emitted by the mono-stable vibrator and the signal of unknown frequency directed to the Zener diode.

Also, U.S. Pat. No. 3,704,414 to Herbst discloses a frequency monitor for monitoring the period of a periodic waveform. The input frequency is connected to a means for detecting a zero crossing, which means includes a high gain filter whose output is differentiated by a resistor capacitor network. Accordingly, the result is a narrow pulse at the beginning of each cycle period, and at the output of the zero crossing detector. The reference frequency source is a stable frequency generator, which generates a series of pulses having a frequency very much higher than the frequency of the input source to be measured. Counters are used to count the pulses during the period between zero crossings with a first counter covering the bulk of the period and a second counter covering the remainder. The count in the second counter is periodically stored and fed to a digital-to-analog convertor which linearizes the currents to energize a meter for indicating the measurement desired. Herbst does not teach or suggest straight line estimation nor shaping of the error signal therefrom.

U.S. Pat. No. 3,743,420 to Iten discloses a method and apparatus for measuring the period of electrical signals. A time marker signal is produced by a zero crossing of an electrical signal. If the electrical signal amplitude exceeds a predetermined level during the use period prior to zero crossing, the time marker signal is produced. Therefore, the time marker signal indicates the number of cycles which have exceeded the predetermined level and the control signal indicates the total duration of those signals. The cycle duration of the time marker signal may then be determined in a counter, which is switched on and set back to zero by the control signal. Alternatively, it is possible to determine the duration of a number of input signal periods from the control signal, with the aid of the input signal periods from the control signal, and the time marker signal. The method and apparatus disclosed by Iten are especially useful for increasing the spatial resolution of flow probes.

U.S. Pat. No. 3,839,673 to Acker discloses a frequency measuring circuit, whereby an unknown frequency is determined by changing the signal to a square wave.

U.S. Pat. No. 3,984,773 to Oda discloses a pulse counting rate meter, which operates by directing a shaped pulse through a low-pass filter.

U.S. Pat. No. 4,028,985 to Merritt determines pitch or frequency of signals by use of an inhibit circuit to reject spurious peaks. Similarly, Peoples, U.S. Pat. No. 4,326,261 discloses a tone detector using a filter.

All in all, the prior art is devoid of a frequency measuring apparatus and method, whereby a period of a sinewave signal is counted at each occurrence of a change of sign from negative to positive. Errors are eliminated and noise is reduced by equally spaced output sample signals. Thus, the prior art is devoid of a zero-crossing approximation method coupled with the counting means for counting samples between zero crossings.

OBJECTS AND SUMMARY OF THE INVENTION

A primary object of the present invention is to measure the frequency of a sinewave by use of a zero crossing detector, a control feedback circuit and a low pass filter output conditioning circuit.

Another object of the present invention is to provide a method whereby the frequency of a sinewave may be accurately determined.

A further, and more particular object of the present invention is to provide frequency measuring coupled with the reduction of noise.

These and other objects are provided by a method and apparatus according to the present invention which features an apparatus and method for measuring the frequency of an incoming sampled sinewave. The frequency estimation or measurement is triggered by a "zero-crossing" of a sinewave, which is indicated when the sign of sequential samples changes from negative to positive. Thus, period inspection and termination of the sinewave is computed at each occurrence of the zero-crossing. The period is calculated on the basis of an approximation of the sinewave, through the zero-crossing as a straight line between two samples. Errors in the period measurement, including errors made in the estimation of zero-crossings, errors due to the quantization of samples, and errors due to noise, are shaped toward a high frequency region, and are eliminated by passage through a low-pass filter. The low-pass filter may perform an averaging function, though the use of a more sophisticated low-pass filter may be indicated. The averaging filter is the simplest type of low-pass filter. Its attenuation is 6 decibels per octave. More sophisticated filters with an attenuation of at least 12 decibels per octave are better suited for use with this invention. An important aspect of the invention is the reduction of noise by equally spacing output sample signals.

Use of the present invention is thus enabled for any of a variety of frequency measurements, including detection of tones in a telephone system, analyzing a Doppler effect and in frequency-shift keying systems.

BRIEF DESCRIPTION OF THE DRAWINGS

Other objects, features and advantages of the present invention will become apparent by use of the following more detailed description of the invention, reference to the accompanying drawings wherein:

FIGS. 3(a-c) illustrate the basic principal of operation of the frequency estimator of FIG. 2;

FIGS. 5(a-b) still further illustrate the operation of the frequency estimator of FIG. 2, specifically with respect to use of an averaging operation to eliminate error;

FIG. 12 represents the method and apparatus shown in FIG. 11, in block diagram form, but with uses of a memory storage, as well as a low-pass filter; in other words, FIGS. 11 and 12 are the equivalent of the general block diagrams of FIGS. 8 and 9, in which the frequency estimator of FIG. 2 is substituted with the simplified version of FIG. 10;

FIG. 18(a-d) represent respectively, an analog sinewave input, the generation of a pulse by a zero-crossing trigger circuit each time a negative to positive zero-crossing occurs, the use of the pulse of FIG. 13b to store the counter contents and to reset the counter (FIGS. 13c, d), in the operation according to FIG. 11;

DETAILED DESCRIPTION OF THE INVENTION

In addition to the prior art set forth in the introduction hereof, one of the most common methods used for detection of a sinewave is the Fast Fourier Transform. The Fast Fourier Transform indicates a number of points, which limits the precision with which the frequency of the sinewave can be measured. The present invention has a much higher precision which is achieved with less computational effort.

Furthermore, the publication "Applications of Digital Signal Processing" edited by Alan J. Oppenheim, Prentice Hall 1978, page 16, recommends use of a trigger circuit for generating a pulse each time a zero-crossing of a sinewave occurs. Frequency information is thereby obtained by averaging the number of pulses in a certain interval. The present invention operates differently, wherein instead of determining the frequency by measuring the average number of pulses, the interval between pulses is measured. Higher precision, avoiding distortions, is thereby achieved.

Figure 1:
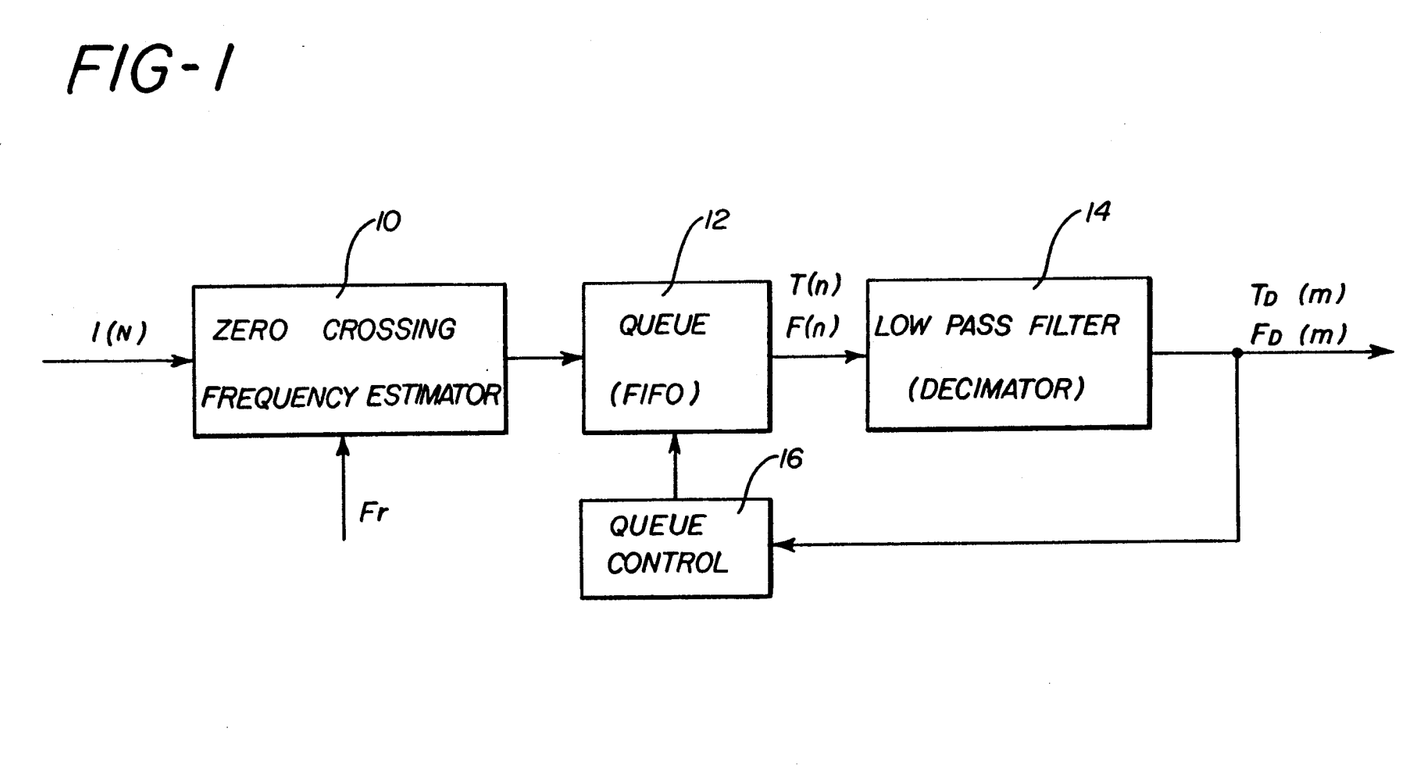
FIG. 1 is a block diagram of a method and apparatus according to the present invention.

Referring to FIG. 1, a general block diagram of the apparatus and method of the present invention is shown. A frequency estimator 10, a queue 12 and a low-pass filter 14 are shown, along with a queue control. The function of frequency estimator 10 is accomplished based on the computation of the interval between two zero-crossings; and the queue 12 insures that the estimator output samples are equally spaced in time. The low-pass filter 14 eliminates error signals as will be described.

Figure 2:
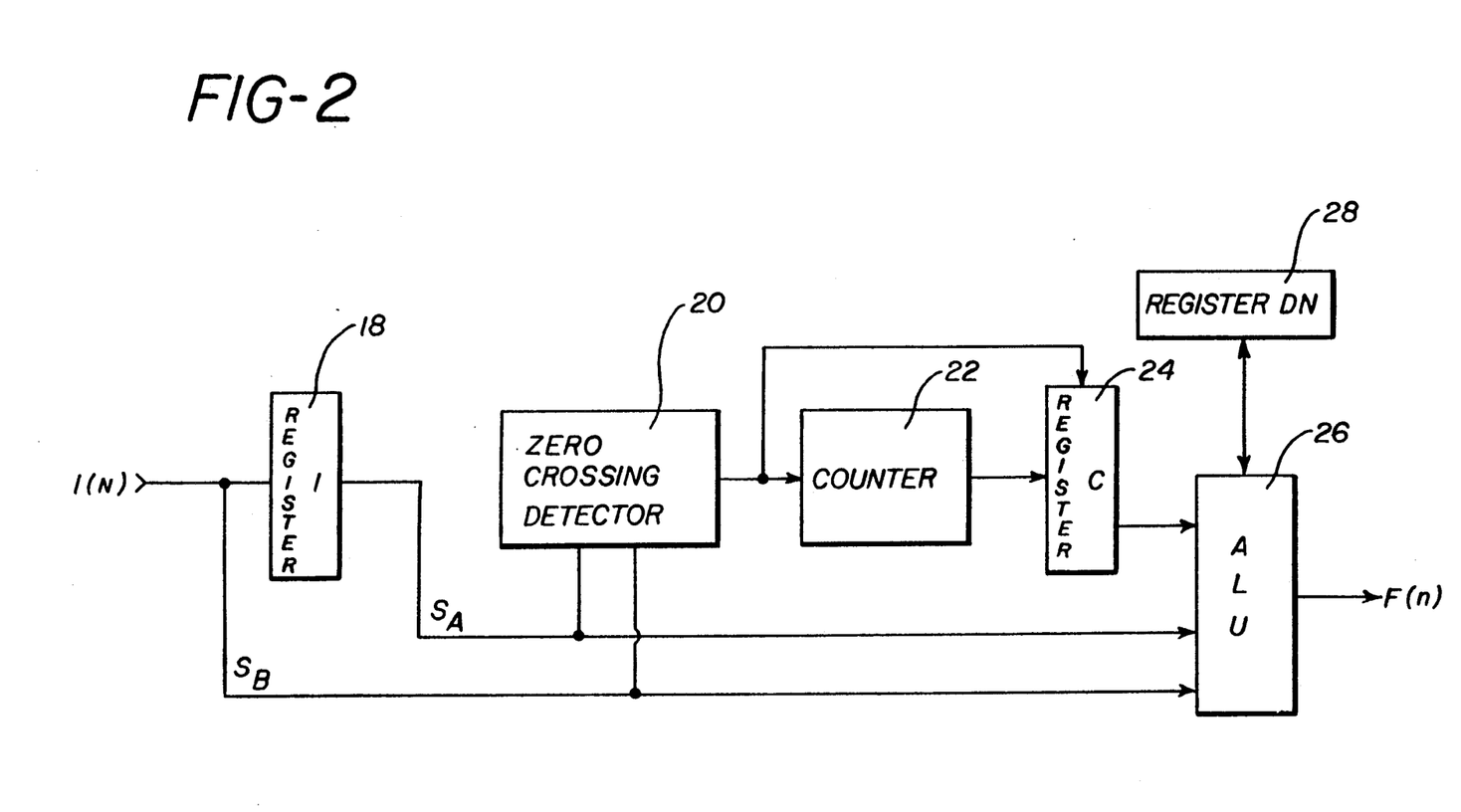
FIG. 2 is a block diagram of a frequency estimator, according to the present invention useful in the general diagram of FIG. 1.
Figure 3:
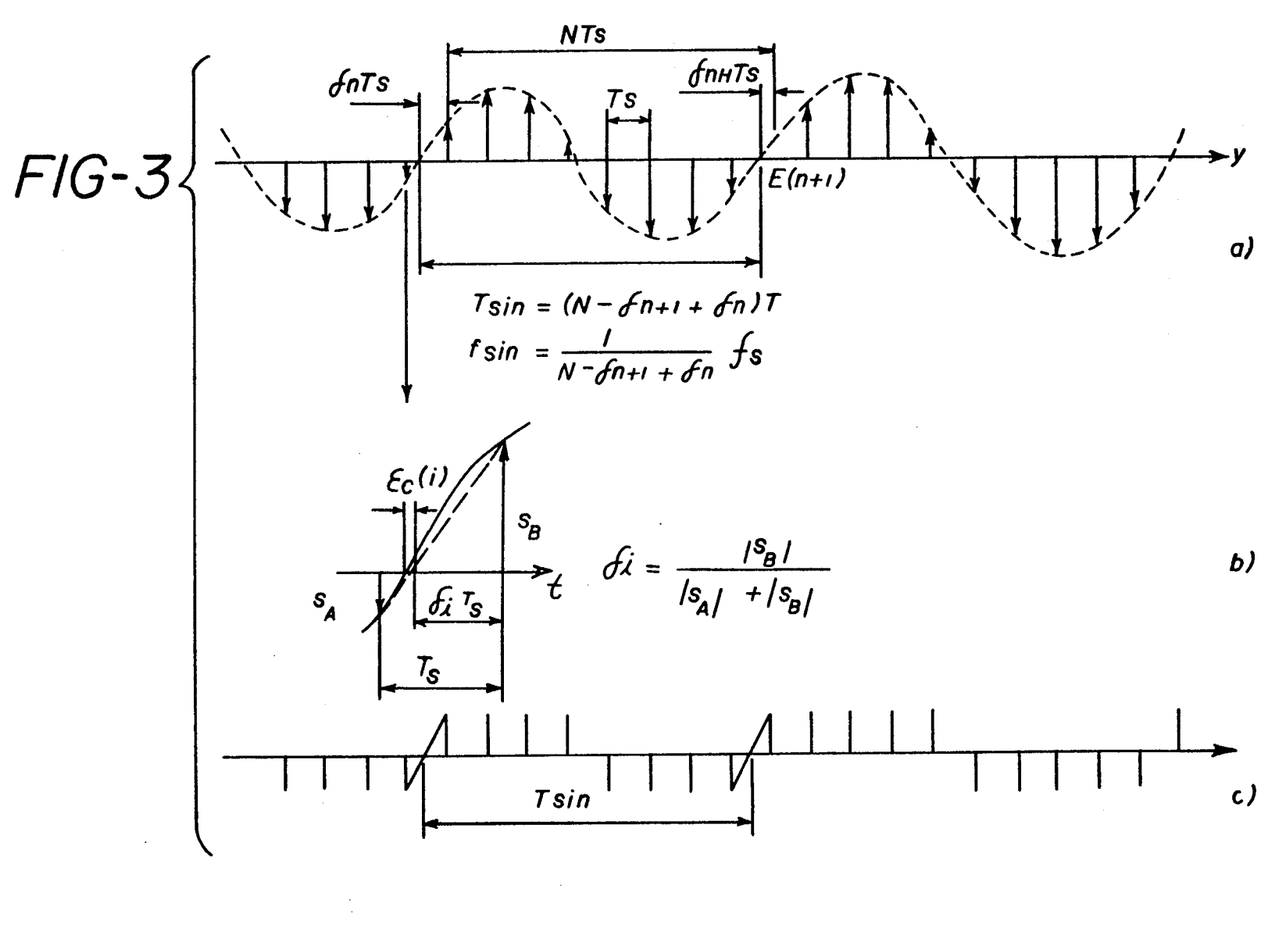

In more detail, the frequency estimator 10 is shown in FIG. 2, wherein Register I, reference numeral 18, includes the previous sample, and detector 20 determines if a zero-crossing occurred by examining the sign of the present sample $S_B$ and the sign of the previous sample $S_A$. For instance, if the present sample as shown in FIG. 3b is positive and the sign of the previous sample $S_A$ is negative, a zero-crossing has occurred.

Accordingly, when a zero-crossing had occurred counter 22, which increases its value every time a new sample arrives, is loaded into Register C, designated with reference numeral 24. At that time, counter 22 is reset. The period of the sinewave is computed by means of the time interval between the zero-crossing and the moment the counter is reset, as computations are performed by ALU 26. Counter 22 causes ALU 26 to adjust the interval as measured by the counter $NT_S$, where N is the count number stored in Register 24 and $T_S$ is the sampling period. Thus, FIG. 3a graphically represents the time interval between the zero-crossing and the moment the counter 22 is reset: $\delta_n T_S$, $\delta_{n+1} T_S$. The period of the sinewave $T_{sin}$ and its frequency $f_{sin}$ are equal to:

$$T_{sin} = (N - \delta_{n+1} + \delta_n)T_s \qquad \text{[equation 1a]}$$

$$f_{sin} = \frac{1}{T_{sin}} = \frac{1}{N - \delta_{n+1} + \delta_n} f_s \qquad \text{[equation 1b]}$$

-continued where:

$$\delta i = \frac{|S_B|}{|S_A| + |S_B|} \quad \text{[equation 2]}$$

is computed each time a zero-crossing occurs, by approximating the sinewave with a straight line around the zero-crossing as shown in FIG. 3b. This value is stored in Register DN 28 (see FIG. 2); and will be used for the computation for the next period (in equation 1a and 1b).

Figure 4:
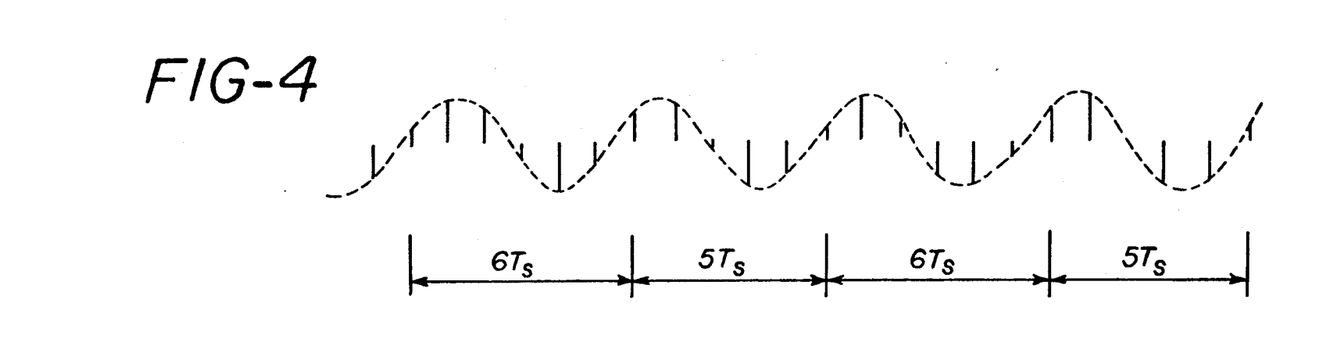
FIG. 4 further illustrates the operation of the frequency estimator of FIG. 2.

Because the zero-crossing frequency estimator 10 in FIG. 1 generates an output sample each time a zero-crossing occurs, the output samples are not equally spaced in time. For instance, if the period of the sinewave is 5 and ½ times the sampling period (see FIG. 4), half of the samples coming from frequency estimator 10 are generated at intervals equal to $5T_S$, while the other half are at $6T_S$ intervals. This occurs because evaluation is accomplished only at intervals determined by the input sampling rate.

Figure 5:
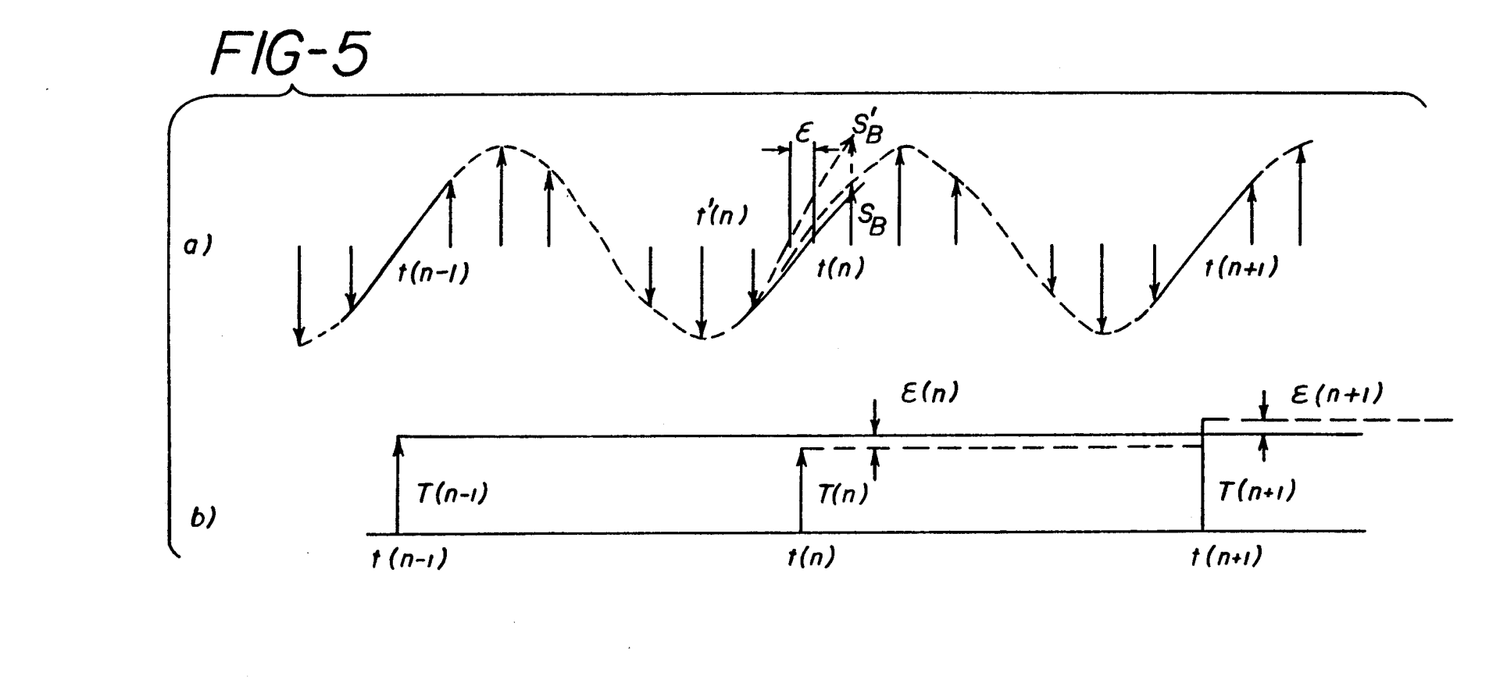

From the conceptual point of view, these samples are construed as if they are equally spaced in time. Equal spacing is achieved by passing samples through queue 12 (FIG. 1) with its own control block 16, to shift these samples based upon the sinewave frequency information coming from output $F_D(m)$ shown in FIG. 1. This concept of equal spacing between output samples of the frequency estimator is critical to the signal to noise ratio performance of the apparatus. FIGS. 5a, 5b show a sinewave of frequency fs/8, together with the queue output samples. If erroneously, the sample $S'_B$ (dashed line in FIG. 5a) is received instead of the sample of $S_B$, the zero-crossing time will be advanced from t(n) to t'(n). The computed period sample T(n) is smaller by $\epsilon = t(n) - t'(n)$, but the next sample for the period of sinewave T(n+1) is increased by the same amount. This error is eliminated by an averaging operation accomplished by a low-pass filter, which eliminates the high frequency noise.

If $\epsilon(n)$ indicates the error made in determining the $n^{th}$ zero-crossing t(n):

$$t(n) = nT + \epsilon(n) \quad \text{[equation 3]}$$

the period of the sinewave T(n) computed at that time will be:

$$Tn = t(n) - t(n-1) = T + \epsilon(n) - \epsilon(n-1) \quad \text{[equation 4]}$$

Applying the z-transform on both sides of the equation 4 we obtain:

$$T(z) = T + (1 - 2^{-1})\epsilon(z) \quad \text{[equation 5]}$$

where T(z), $\epsilon(z)$ are the z-transform for the period, respectively, the error or the noise $\epsilon$. The effect of computing the period of the sample based on the interval between two zero-crossings or the errors which may be generated during the process, consists of shaping of the error spectrum $\epsilon(f)$ with the function H(z):

$$H(z) = 1 - Z^{-1} \quad \text{[equation 6]}$$

which has the amplitude characteristic $$|H(f)| = 2 \sin [\pi f / f_{sin}] \quad \text{[equation 7]}$$

where $f_{sin}$ is the frequency of the measured sinewave.

Figure 6:
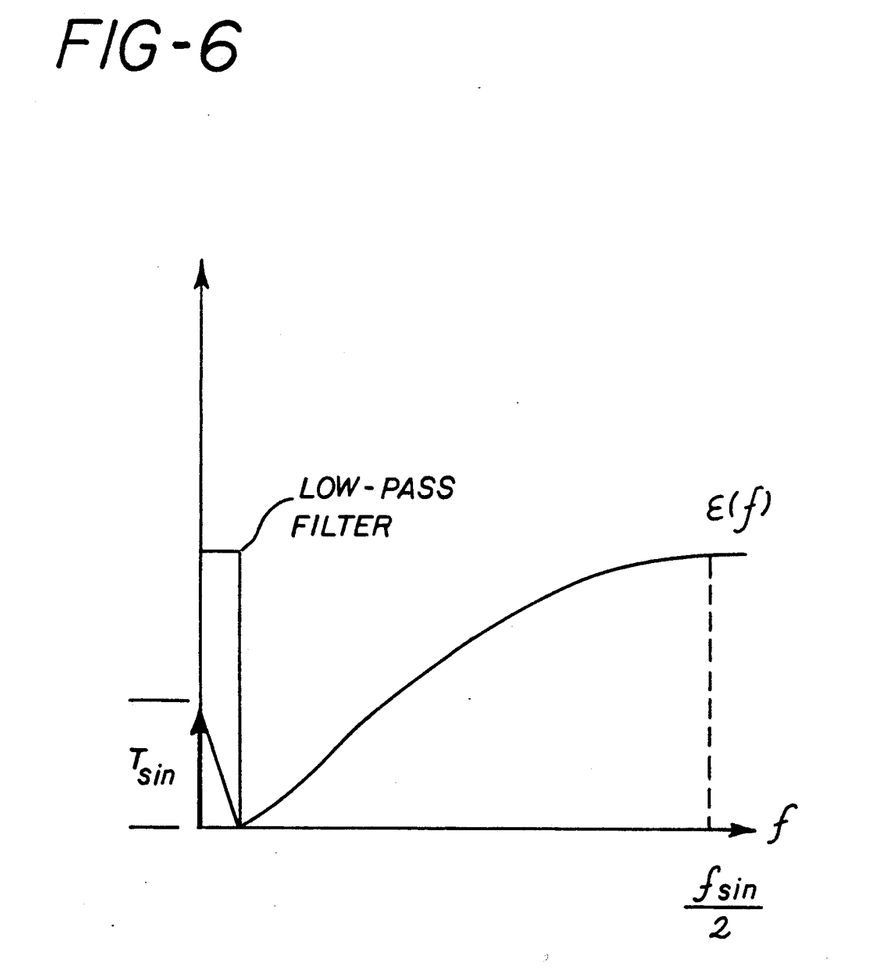
FIG. 6 graphically illustrates the use of a low-pass filter for eliminating error, by low-pass filtering of the high frequency error spectrum.

Around DC $|H(f)| \approx 0$ (FIG. 6), the spectrum of the error is shaped towards the high frequency region and it can be removed by a low-pass filter (14 in FIG. 1) as shown in FIG. 6. The DC value at the output of the filter will contain the correct value of the period $T_{sin}$ or the frequency $f_{sin}$ of the sinewave and the error can be made as Small as necessary, by using a properly designed low-pass filter.

In the case of filters with a band much smaller than $f_{sin}$, this may require a decimation operation, i.e. a reduction in the sampling rate. For frequency or phase modulated signals, the pass-band filter has to be sufficiently large so that the output modulating signal will not be distorted.

This mechanism of eliminating the error, applies to all possible sources of errors, among them:

errors made in the estimation of the zero-crossings (for instance the error $\epsilon_c(i)$ made by approximating the sinewave with a straight line in FIG. 3b).

errors due to the quantization of the samples $S_A$, $S_B$ FIG. 3b).

errors due to noise.

Figure 7:
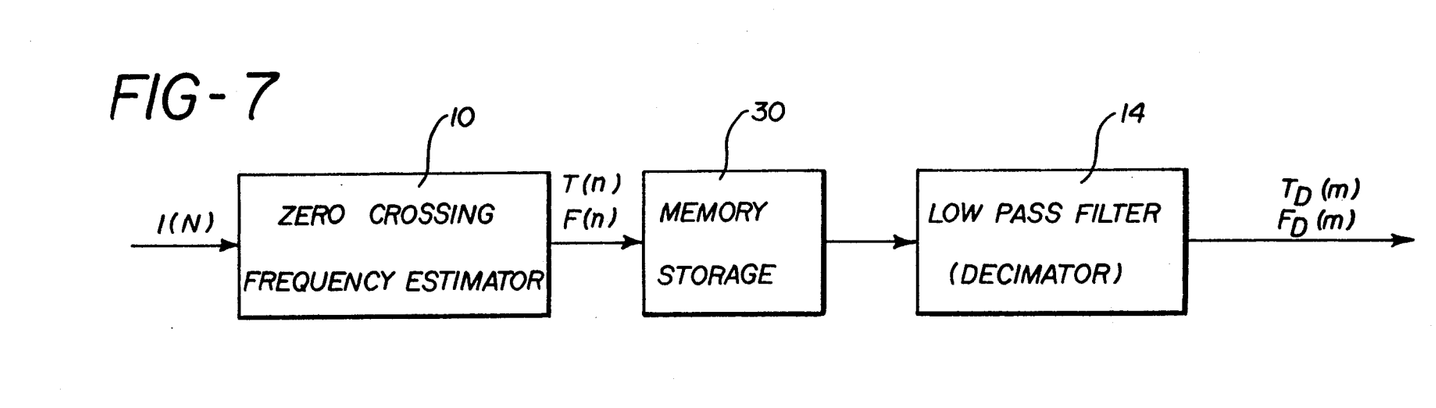
FIG. 7 is a block diagram, according to the present invention, with a storage element substituted for the queue of FIG. 1.
Figure 8:
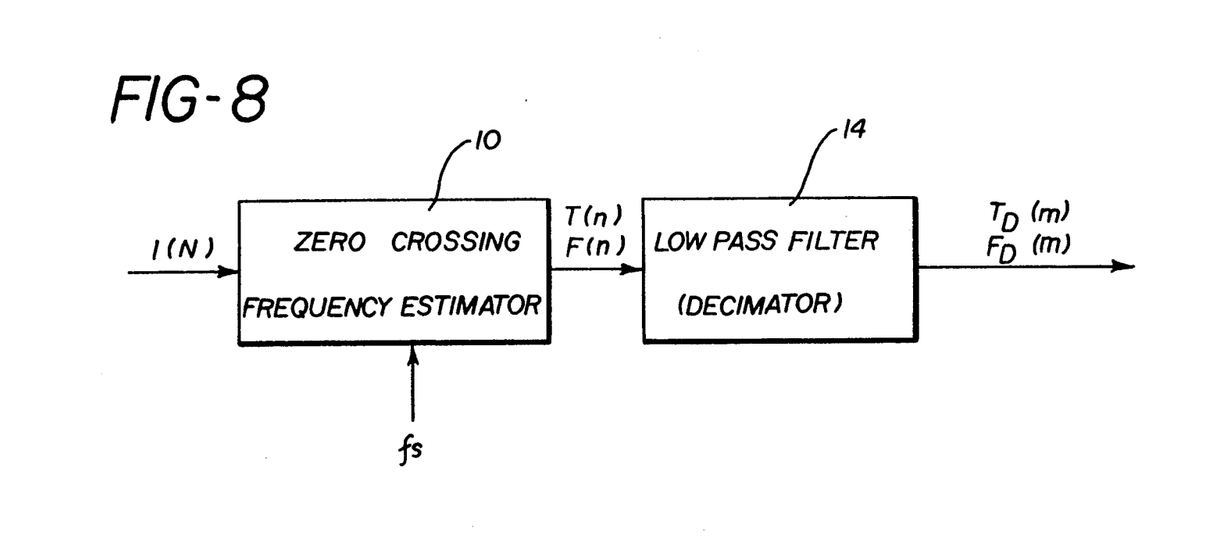
FIG. 8 is a block diagram of apparatus and method according to the present invention, showing an alternative embodiment wherein the queue of FIG. 1 is eliminated completely.

The queue can be substituted with a storage element (30) in FIG. 7), where all the samples are stored before subsequent processing. It can be eliminated completely, as shown in FIG. 8, where the subsequent signal processing (low-pass filtering, decimation) is event driven, in other words, a computational sequence is initiated each time a zero crossing is detected. This way, the concept of equal spacing between the samples at the output of the estimator is preserved.

Figure 9:
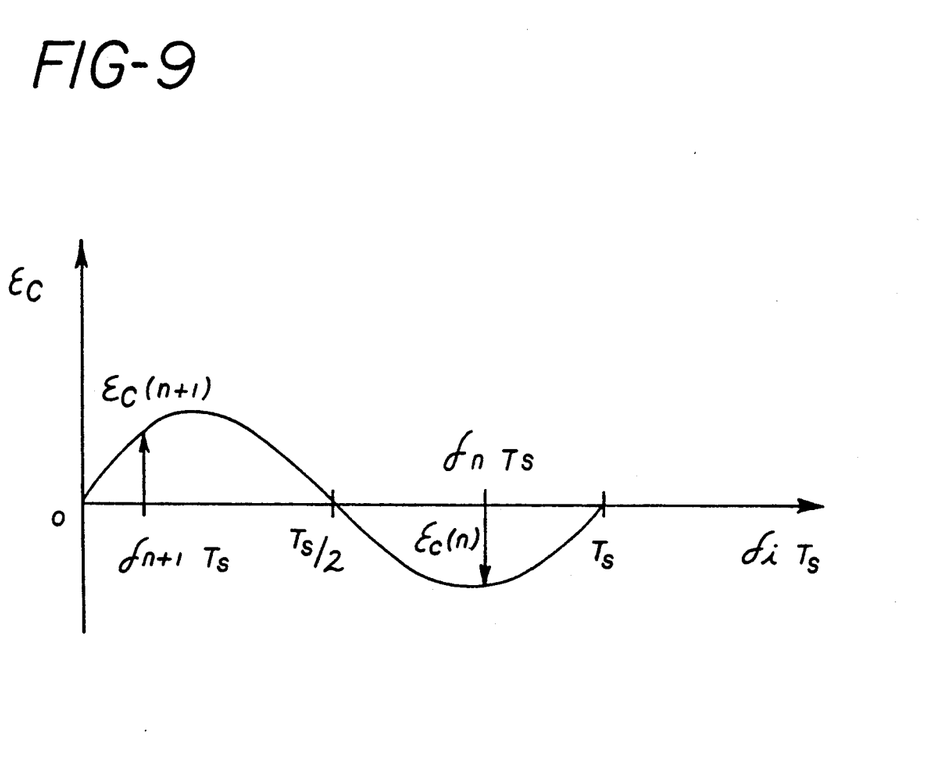
FIG. 9 graphically illustrates the present invention apparatus and method, wherein the curve for computational errors, when the sinewave is approximated with a straight line (see FIG. 3b), is a function of interval.
Figure 10:
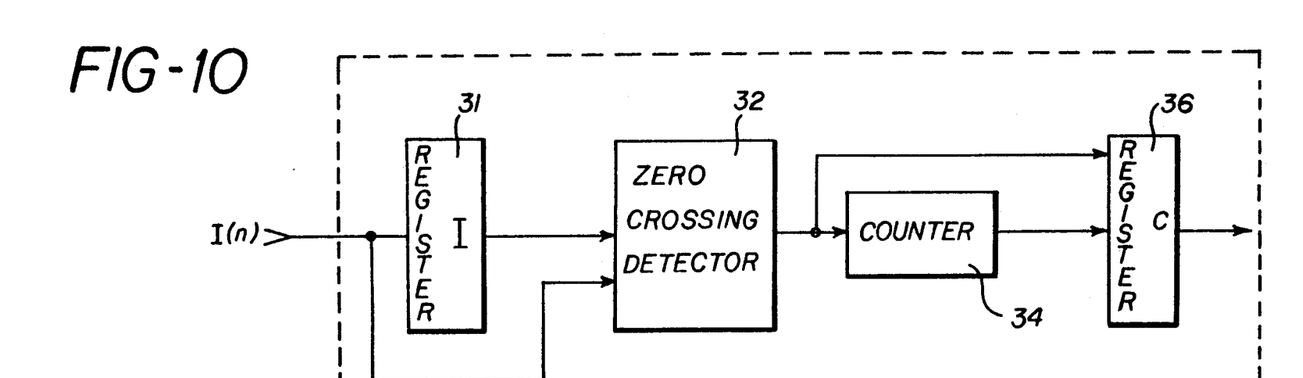
FIG. 10 is a block diagram according to the present invention showing the invention according to FIG. 2, but with the zero-crossing function reduced to a detector and a counter, so that the count is used for the period each time a zero-crossing occurs; in other words, the frequency estimator shown in FIG. 10 is a simplified version of that of FIG. 2, in which the quantities $\delta_n$ of equation 1a (hereinafter) and $\delta_{n+1}$ are not used any more.

Another feature of the invention provides additional attenuation of the computational errors $\epsilon_c(i)$ (FIG. 3b). FIG. 9 shows the curve for computational errors, when the sinewave is approximated with a straight line (FIG. 3b), as a function of the interval $\delta i T_s$. The error is zero when $S_A$ or $S_B$ are equal to 0, $(\delta i T_s) = 0$, respectively T(s) or $|S_A| = |S_B|$, $\delta i T_s = T_s / 2$.

The error samples $\epsilon_c(n)$ are strongly correlated. If the position of $\epsilon_c(n)$ is known on the curve from FIG. 9, $\epsilon_c(n+1)$ can be found by computing the differences between the abscissas of the two samples from equation 1a:

$$\delta_{n+1} T_s - \delta_n T_s = N T_s - T_{sin} \quad \text{[equation 8]}$$

where the value of the counter N is such that the term on the right side of the equation 8 is minimal in absolute value. As a result, the spectrum of the computational error $\epsilon_c$ is discrete. For small variation in time of the sinewave frequency $f_{sin}$, as in the case of the Doppler effect, the computational error spectrum will be concentrated around the spectrum corresponding to the average frequency value.

The interval between the error samples (equation 8) and therefore the fundamental frequency of the error spectrum, depends on the sampling period $T_S$ and the period of the sinewave $T_{sin}$. If the approximate value of the sinewave to be measured is known beforehand, the sampling rate can be chosen such that the most important frequency components of the computational error spectrum are pushed outside the signal band and are eliminated by the low-pass filter (the filter is designed to have transmission zeros around the frequencies corresponding to these components). This will further improve the precision of the apparatus.

A further simplification of the zero-crossing detector from FIG. 2 is possible when the number of quantization bits of the input samples is reduced to one, indicating just the sign (the sinewave is rectified to a square wave, as shown in FIG. 3c). In this case $\delta n+1 = \delta n = 0.5$ and equation 1 becomes:

$$T_{sin} = NT_SF_{sin} = (1/N)f_S \quad \text{[equation 9]}$$

The zero-crossing estimator (FIG. 10), is reduced to a detector 32, which generates a pulse, each time a zero-crossing occurs. This pulse stores the value of the counter 34, which counts the number of samples, in the Register C 36 and resets the counter. The output sample is the count N(n), which can be subsequently processed, as shown in FIGS. 1, 7, 8, 10 and from which the period and the frequency of the sinewave can be computed according to equation 9.

Figure 11:
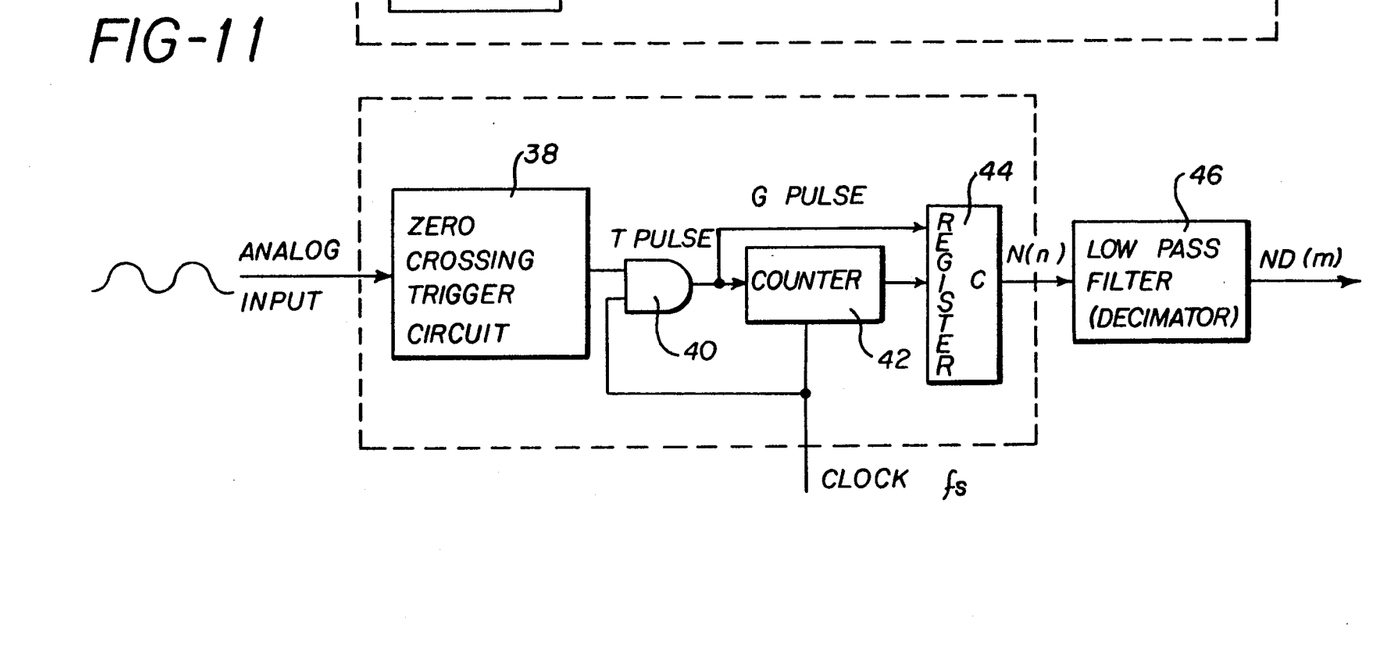
FIG. 11 expands the principal of operation of the apparatus and method of FIG. 10, so that the period or frequency of analog signals are measured, the low-pass filter computation is started each time a zero-crossing is detected.
Figure 12:
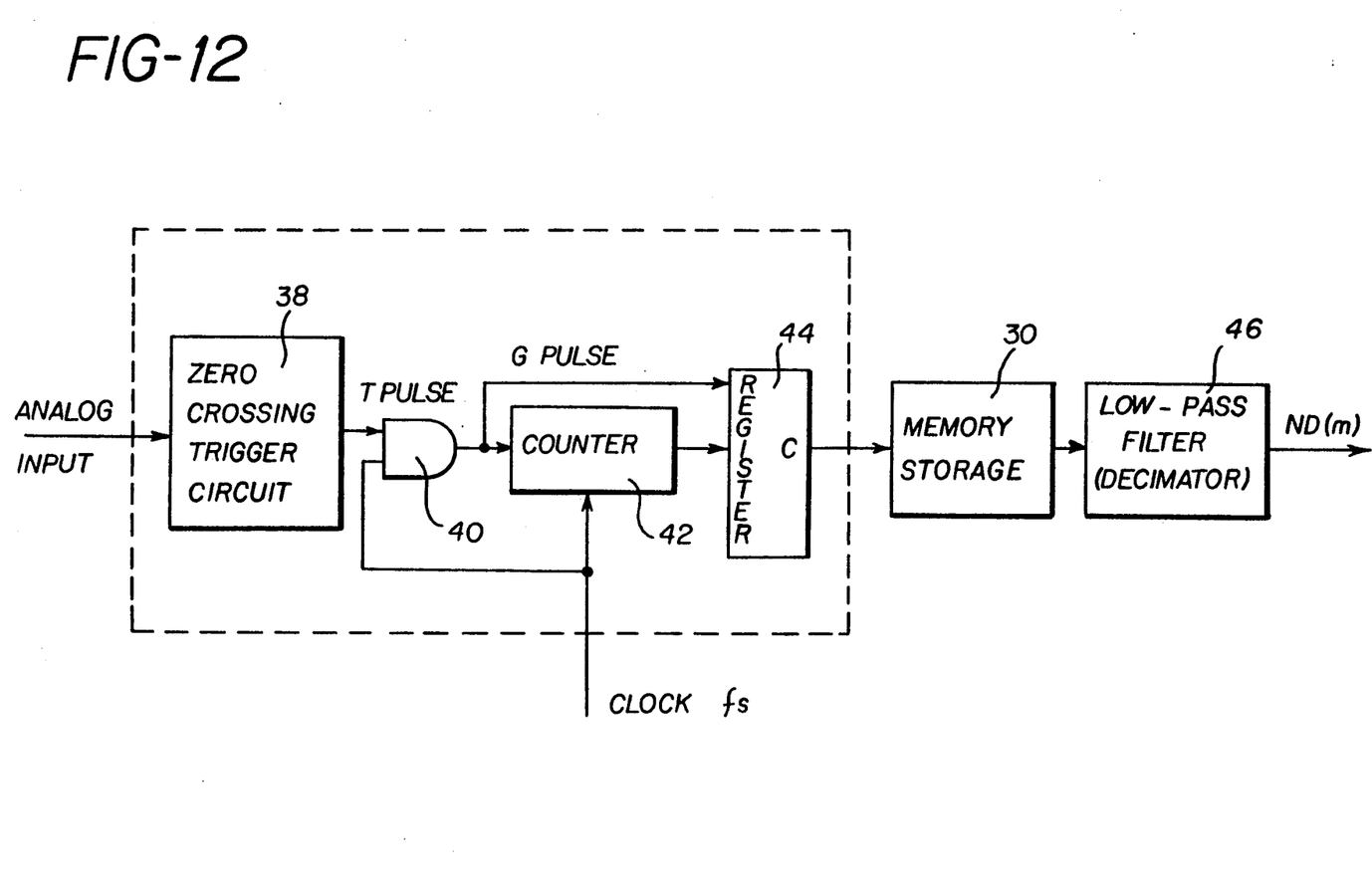
Figure 13:
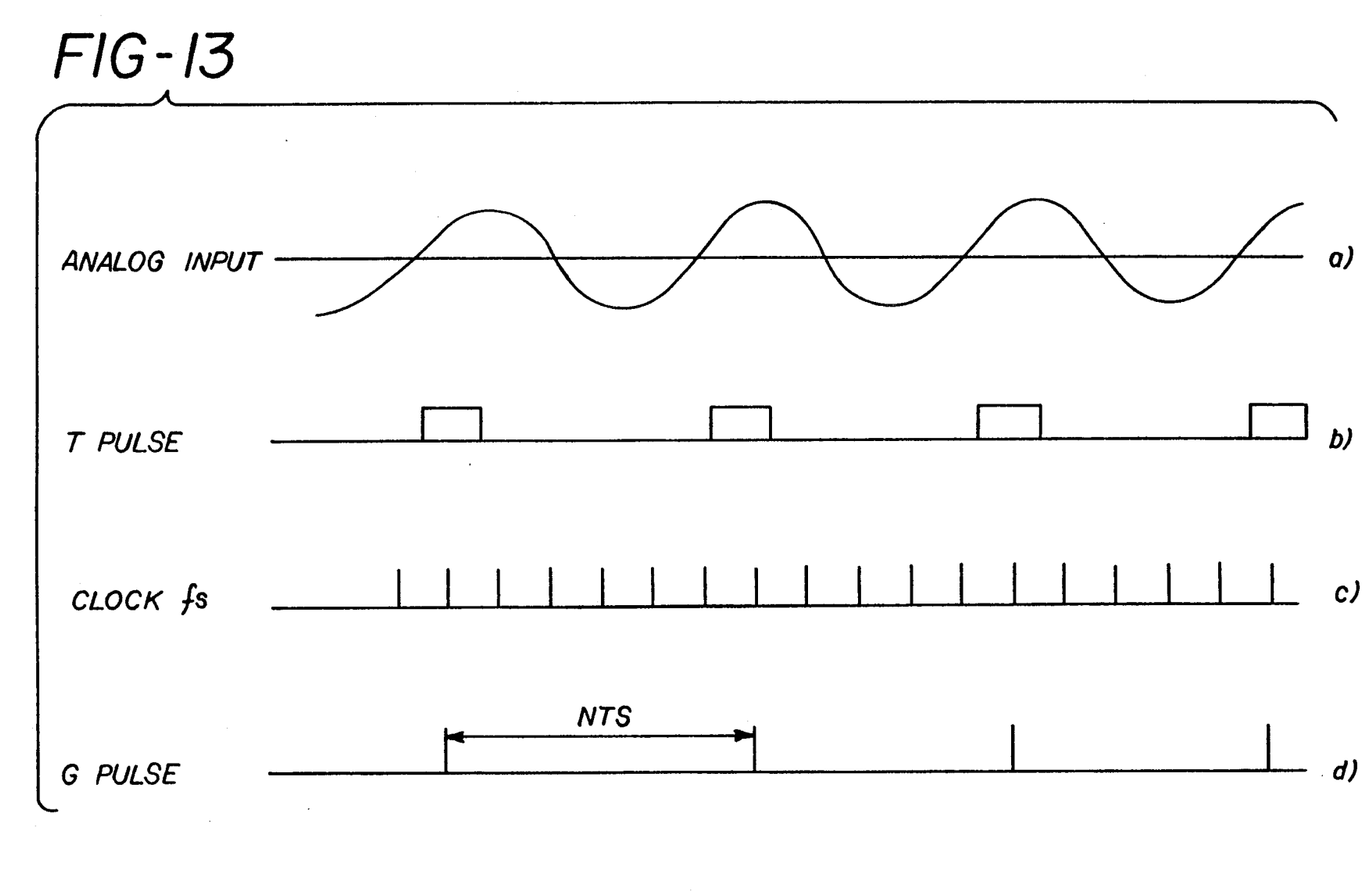
Figure 14:
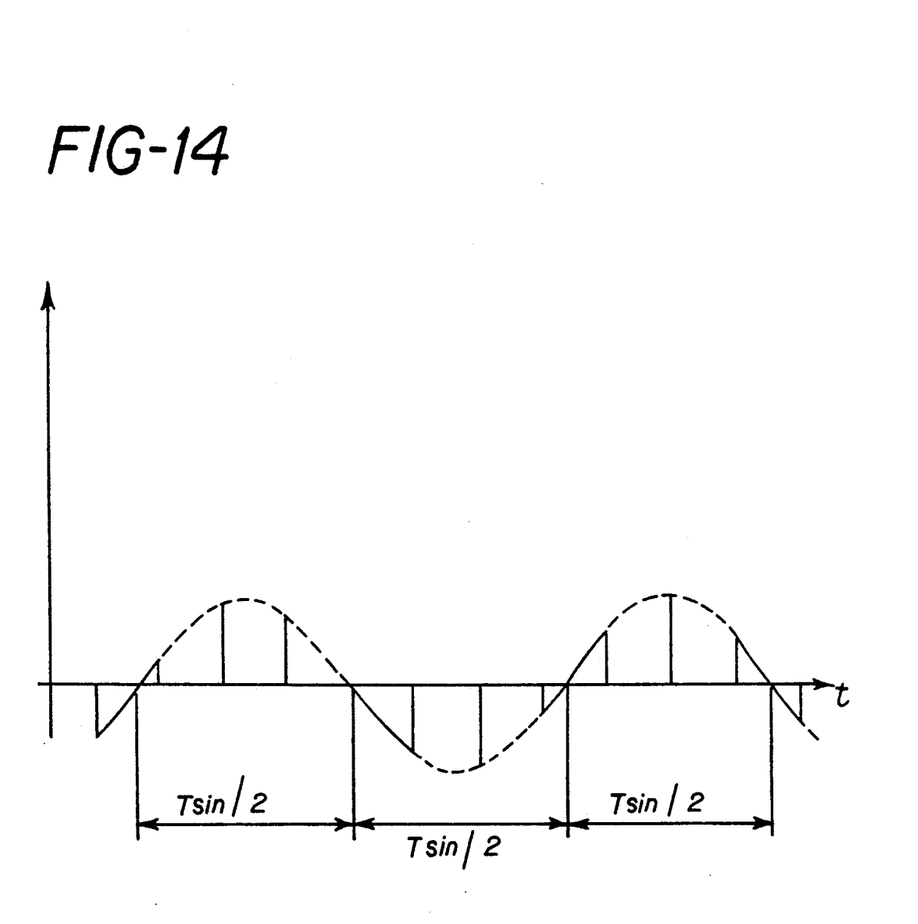
FIG. 14 graphically illustrates a circumstance when using the present invention which involves the use of a half period interval as a base for estimation.

This principle of operation can be expanded for the direct period (frequency) measurement of the analog signals (FIG. 11). The input to the circuit is an analog sinewave (FIG. 13a); a zero-crossing trigger circuit (38 in FIG. 11) generates a pulse each time a negative to positive zero-crossing occurs (FIG. 13b). This pulse, gated 40 by the clock of frequency $f_s$ (FIG. 13c, 13d), is used to store the contents of the counter 42, running at the clock rate $f_s$, in the register C 44 and to reset the counter. The subsequent signal processing consists of low-pass filtering (decimation) of the count number N(n), from which the period (frequency) of the sinewave may be computed according to equation 9. The supplementary errors due to the jitter in the trigger circuit 38, will be also shaped as in FIG. 6 such that most of the error is pushed toward the high-frequency spectrum and will be removed by the low-pass filter.

Although measurement of the period or frequency of a sinewave by using a counter started by a zero-crossing pulse is well known, the present invention performs a low-pass filter operation over the count N(n) which allows for a counter that runs at a much lower clock frequency to be used.

Figure 15:
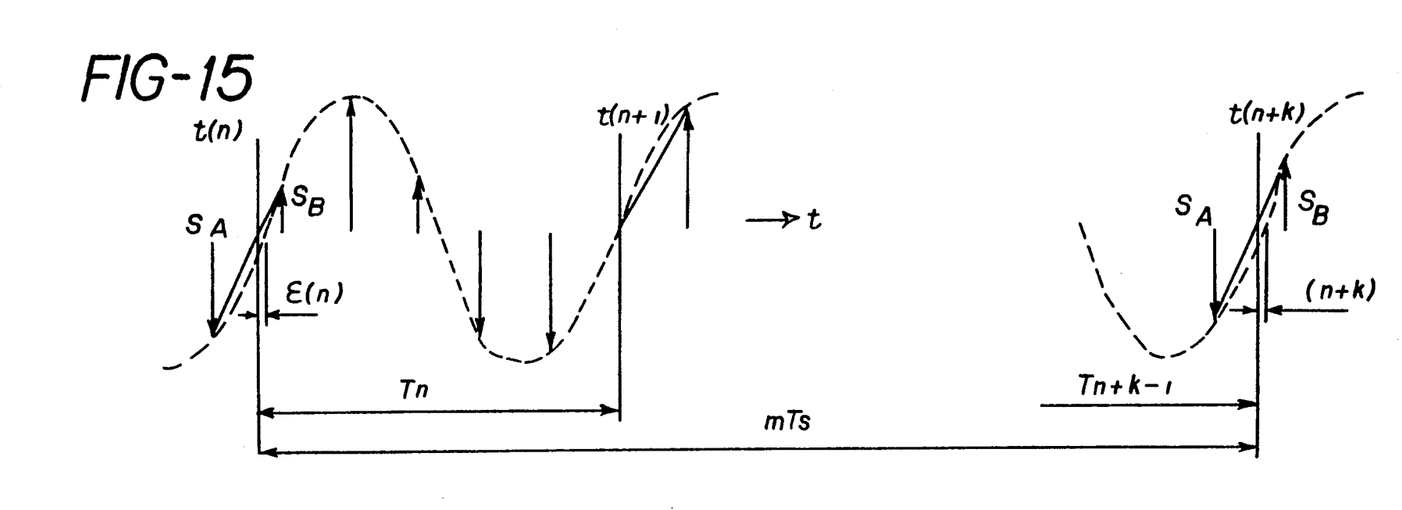
FIG. 15 and 16 represent an alternative embodiment.

Another method to cancel the computational error is based on the fact that if the interval between the two zero-crossings t(n), t(n+k) in FIG. 15 is an integer number of samples i.e.

$$k\, T_{sin} = mT_S \quad \text{[equation 10]}$$

(k and m being integers), the position of the two zero-crossings t(n), t(n+k) between the data samples $S_A$, $S_B$ (FIG. 15) is the same and the computational errors are identical $\epsilon(n) = \epsilon(n+k)$. These errors will be canceled by an averaging filter of length k described by $$Y(n) = \frac{T_n + T_{n+1} + \ldots + T_{n+k-1}}{k} = \quad \text{[equation 11]}$$

$$\frac{k\,T\sin + \epsilon(n+k) - \epsilon(n)}{k} = T_{sin}$$

Figure 16:
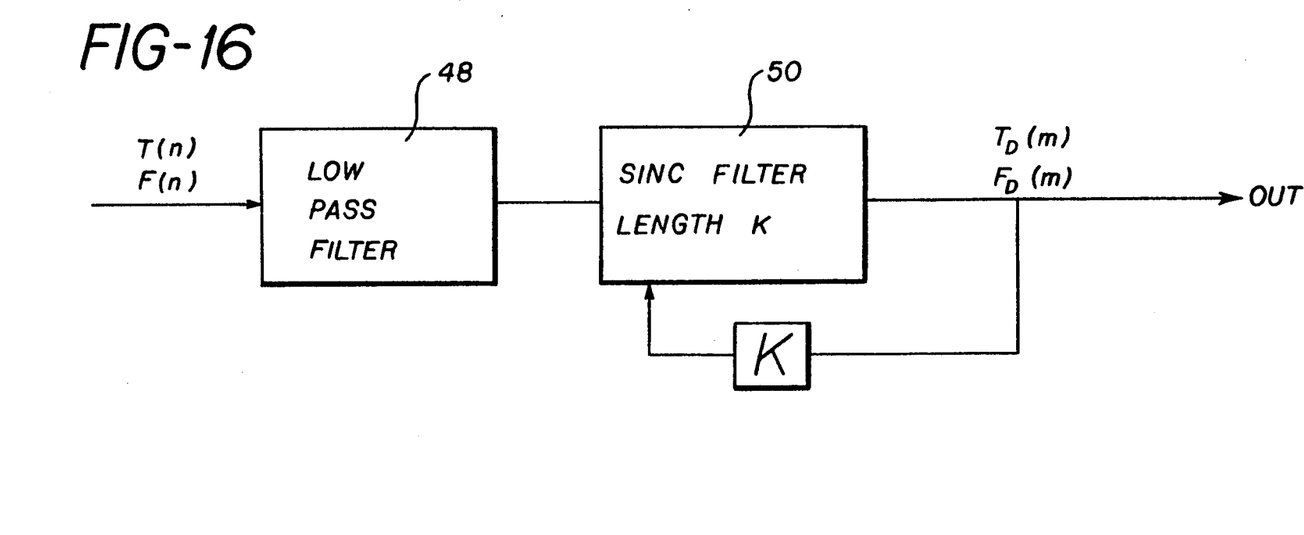

The low-pass filters 14 in FIG. 7 and in FIG. 8 are substituted with a cascade of two filters (FIG. 16) consisting of a general low-pass filter 48 $F_1(Z)$ and a sinc (averaging filter) 50 $F_2(Z)$ of variable length k with the z-transform $$F_2(z) = \frac{1}{k} \cdot \frac{1 - z^{-k}}{1 - z^{-1}} \quad \text{[equation 12]}$$

where the length of the filter k is determined based on the period measured at the output, and k is an integer close to $$kf = M \frac{T_S}{T_D(M)} \quad \text{[equation 13]}$$

where M is the maximum number of taps of the filter 50, and $T_S$ is the sampling period and $T_D(m)$ is the measured period at the output which is used for computation of $K_f$ in equation 13.

What is claimed is:

1. An apparatus for measuring the frequency of a sinewave comprising:
   sample means for sampling a sinewave at sampling intervals determined by a clock, the samples including a first sample prior to a zero-crossing of the sinewave and a second sample after a zero-crossing of the sine wave;
   a zero-crossing trigger circuit for detecting a change in sign between the samples and for generating a pulse;
   gate circuit means for gating the pulse from the zero-crossing trigger circuit with the clock;
   counter circuit means for counting the samples;
   register means for receiving contents of the counter circuit means;
   interpolation means for computing zero-crossings based on the first and second samples by interpolation;
   means for correcting the register means with the interpolation means results; and
   filter means for filtering the corrected register means.

2. The apparatus of claim 1 wherein the interpolation means for computing zero-crossings comprises an arithmetic logic unit (ALU) that computes the zero-crossing by interpolation.

3. The apparatus of claim 2 wherein the ALU computes the zero-crossing by linear interpolation.

4. The apparatus of claim 2 wherein the ALU computes the zero-crossing by quadratic interpolation., 5. The apparatus of claim 4 wherein the filter means is a low-pass filter.

6. The apparatus of claim 5 wherein the low-pass filter includes a general low-pass filter and an averaging filter.

7. The apparatus of claim 6 wherein the low-pass filter has an attenuation of at least twelve decibels per octave.

8. The apparatus of claim 7 wherein the samples are provided at equally spaced intervals.

9. The apparatus of claim 8 further including an output sample means for providing an output sample to the filter means at equally spaced time intervals.

* * * * *